United States Patent [19]

Shiraishi

[11] Patent Number: 5,610,684

[45] Date of Patent: Mar. 11, 1997

[54] PROJECTION EXPOSURE APPARATUS

[75] Inventor: Naomasa Shiraishi, Kanagawa-ken, Japan

[73] Assignee: Nikon Corporation, Tokyo, Japan

[21] Appl. No.: 385,876

[22] Filed: Feb. 9, 1995

[30] Foreign Application Priority Data

Feb. 17, 1994 [JP] Japan ..................................... 6-020190

[51] Int. Cl.$^6$ .................................................. H01L 21/30
[52] U.S. Cl. .............................................. 355/55; 355/53
[58] Field of Search ................................. 355/53, 71, 77, 355/55; 359/559

[56] References Cited

U.S. PATENT DOCUMENTS

| | | | |
|---|---|---|---|
| 4,853,756 | 8/1989 | Matsuki | 355/71 |
| 4,936,665 | 6/1990 | Whitney | 359/565 |
| 5,117,255 | 5/1992 | Shiraishi | 355/53 |
| 5,348,837 | 9/1994 | Fukuda et al. | 430/269 |
| 5,357,312 | 10/1994 | Tounai | 355/67 |
| 5,426,521 | 6/1995 | Chen et al. | 359/9 |

OTHER PUBLICATIONS

Resume Distributed in the Applied Physics Association, Items 29A–ZD–8 and 9, pp. 1–3, Spring, 1991.

"Research on Imaging Capability and Improved Procedure Thereof in Optical System", Government Machinery Report No. 40, Jan., 1961.

Resume Distributed in the Applied Physics Association, Item 30p–NA–5, Spring 1992.

Resume Distributed in the Applied Physics Association, Item 12a–ZF–7, Autumn 1991.

*Primary Examiner*—Arthur T. Grimley
*Assistant Examiner*—David A. Lane
*Attorney, Agent, or Firm*—Armstrong, Westerman, Hattori, McLeland & Naughton

[57] ABSTRACT

A projection exposure apparatus having an illuminating optical system for irradiating a mask having a pattern with illuminating light for exposure, and a projection optical system which is composed of a plurality of optical elements and arranged to take in light emanating from the pattern of the mask and to project an image of the pattern on a photosensitive substrate with predetermined image-forming characteristics. The projection exposure apparatus is provided with a movable retaining member for causing at least one of a plurality of lens elements constituting the projection optical system to move relative to the entire projection optical system in accordance with exchange, loading or unloading of an optical corrector plate, e.g., a pupil filter, which is disposed on a Fourier transform plane of the projection optical system.

22 Claims, 5 Drawing Sheets

PROJECTION EXPOSURE APPARATUS

BACKGROUND OF THE INVENTION

1. Field of the Invention

The present invention relates to a projection exposure apparatus used for forming fine patterns in semiconductor integrated circuits, liquid crystal displays, etc.

2. Description of the Related Art

A projection optical system used in a projection exposure apparatus of the type described above is incorporated in the apparatus after high-level optical designing, careful selection of a vitreous material, superfine processing of the vitreous material, and precise assembly adjustment. The present semiconductor manufacturing process mainly uses a stepper in which a reticle (mask) is irradiated with the i-line (wavelength: 365 nm) of a mercury-vapor lamp as illuminating light, and light passing through a circuit pattern on the reticle is focused on a photosensitive substrate (e.g., a wafer) through a projection optical system, thereby forming an image of the circuit pattern on the substrate. Recently, an excimer stepper that employs an excimer laser (KrF laser of wavelength 248 nm) as an illuminating light source has also been used for evaluation or research purposes.

Generally speaking, in order to faithfully transfer a fine reticle pattern to a photosensitive substrate by exposure using a projection optical system, the resolution and focus depth-of-field (DOF) of the projection optical system are important factors. Among projection optical systems which are presently put to practical use, those which are designed for the i-line include a projection optical system having a numerical aperture (NA) of about 0.6. In general, for a given wavelength of illuminating light, as the numerical aperture of the projection optical system is increased, the resolution improves correspondingly. However, the focal depth (DOF) decreases as the numerical aperture NA increases. The focal depth is approximately given by $DOF=\pm\lambda/(2\times NA^2)$, where $\lambda$ is the wavelength of illuminating light.

Incidentally, the resolution is improved by increasing the image-side numerical aperture NAw (cf. the object-side numerical aperture NAr) of the projection optical system. Increasing the image-side numerical aperture NAw is the same as increasing the pupil diameter, i.e., increasing the effective diameter of an optical element, e.g., lens, which constitutes the projection optical system. However, the focal depth DOF decreases in inverse proportion to the square of the numerical aperture NAw. Accordingly, even if a projection optical system of high numerical aperture can be produced, the required focal depth cannot be obtained; this is a large problem in practical use.

Assuming that the wavelength of illuminating light is 365 nm of the i-line and the numerical aperture NAw is 0.6, the focal depth DOF decreases to about 1 μm (±0.5 μm) in total range. Accordingly, a resolution failure occurs in a portion where the surface unevenness or the curvature is greater than DOF within one shot region (which is about 20 by 20 mm to 30 by 30 mm square) on the wafer.

In regard to these problems, super-high resolution techniques have been proposed, for example, a phase shift method such as that disclosed in Japanese Patent Application Post-Exam Publication No. Sho 62-50811, and a SHRINC (Super High Resolution by Illumination Control) method disclosed, for example, in WO92/03842, Japanese Patent Application Disclosure (KOKAI) No. Hei 04-180612 and Japanese Patent Application Disclosure (KOKAI) No. Hei 04-180613 (corresponding to U.S. Ser. No. 791,138 filed on Nov. 13, 1991). With these techniques, however, advantages such as an improvement in the resolution and an increase in the focal depth can be effectively obtained when a circuit pattern to be transferred is a periodic pattern having a relatively high density. However, substantially no effect can be obtained for discrete patterns (isolated patterns) such as those called "contact hole patterns" in the present state of the art.

In order to enlarge the apparent focal depth for isolated patterns, e.g., contact holes, an exposure method has been proposed in, for example, U.S. Pat. No. 4,869,999, in which exposure for one shot region on a wafer is carried out in a plurality of successive exposure steps, and the wafer is moved along the optical axis of the projection optical system by a predetermined amount during the interval between each pair of successive exposure steps. This exposure method is called FLEX (Focus Latitude Enhancement Exposure) method and provides satisfactory focal depth enlarging effect for isolated patterns, e.g., contact hole patterns. However, the FLEX method indispensably requires multiple exposure of contact hole images which are slightly defocusd. Therefore, a resist image obtained after development inevitably lowers in sharpness (steepness of the rise of the edge of the resist layer).

The Super-FLEX method published in Extended Abstracts (Spring Meeting, 1991) 29a-ZC-8, 9, The Japan Society of Applied Physics, is well-known as an attempt in increasing the focal depth during projection of a contact hole pattern without moving the wafer along the optical axis during the exposure operation, as in the case of the FLEX method. In the Super-FLEX method, a phase filter having a concentric amplitude transmittance distribution centered at the optical axis is provided on the pupil plane (i.e., a Fourier transform plane with respect to the reticle) of the projection optical system so as to increase the effective resolution and focal depth of the projection optical system by the action of the filter.

It should be noted that a method wherein the transmittance distribution or phase difference is changed by filtering at the pupil plane of the projection optical system to thereby improve the focal depth as in the case of the Super FLEX method, is generally known as "multifocus filter method". The multifocus filter is detailed in the paper entitled "Study of Imaging Performance of Optical System and Method of Improving the Same", pp.41–55, in Machine Testing Institute Report No. 40, issued on Jan. 23, 1961. The method of improving the image quality by spatial filtering at the pupil plane is generally called "pupil filter method".

The assignee has proposed as a new type of pupil filter a filter of the type that blocks light only in a circular region in the vicinity of the optical axis (this filter will hereinafter be referred to as "light-blocking pupil filter") in Japanese Patent Application Disclosure (KOKAI) No. Hei 04-179958 (corresponding to U.S. Ser. No. 76,429 filed on Jun. 13, 1993). The assignee has further proposed a pupil filter named "SFINCS" that reduces the spatial coherence of a bundle of image-forming rays from a contact hole pattern which passes through the pupil plane in U.S. patent application Ser. No. 128,685 filed on Sep. 30, 1993.

Separately from the above-described pupil filters for contact hole patterns, pupil filters which are effective for relatively dense periodic patterns, e.g., line and space (L&S) patterns, have also been reported, for example, in "Projection Exposure Method Using Oblique Incidence Illumination I. Principle" (Matsuo et al.: 12a-ZF-7) in Extended Abstracts (Autumn Meeting, 1991), The Japan Society of Applied Physics, and in "Optimization of Annular Zone Illumination and Pupil Filter" (Yamanaka et al.: 30p-NA-5) in Extended Abstracts (Spring Meeting, 1992), The Japan Society of Applied Physics. These filters are adapted to lower the transmittance (i.e., the transmitted light intensity) of a circular or annular region centered at the optical axis (this type of filter will hereinafter be referred to as "filter for L&S patterns"). In the L&S pattern filter method, the phase of light passing through the filter is not changed, unlike the Super FLEX method.

Among the foregoing various pupil filter methods, the Super FLEX method, the light-blocking pupil filter method and the SFINCS method enable the resolution and focal depth to be effectively increased with respect to isolated contact hole patterns among fine patterns which are to be transferred by exposure. However, for relatively dense patterns, e.g., L&S patterns, these methods cause the resolution to be undersirably low. Therefore, when such relatively dense patterns are to be exposed, it is desirable to unload the pupil filter from the projection optical system or to exchange it for a filter for L&S patterns.

However, the projection optical system is completed through a combination of high-level designing and production and strict adjustment to obtain a favorable projected image, as has been described above. Accordingly, if the pupil filter, which optically changes characteristics of the projection optical system, is merely loaded, unloaded or exchanged, the image-forming characteristics of the projection optical system are undesirably changed and cannot be favorably maintained.

In the case of an exposure apparatus designed on the premise that it will be used only for specific patterns, e.g., contact hole patterns, the projection optical system may be adjusted with a specific pupil filter incorporated thereinto when the system is set up, as a matter of course. However, in reality, in production lines for semiconductor devices or the like, a single exposure apparatus is used for pattern transfer by exposure at various steps in order to increase the production efficiency in the present state of art.

SUMMARY OF THE INVENTION

Under these circumstances, an object of the present invention is to provide a projection exposure apparatus capable of constantly maintaining favorable image-forming characteristics even when a pupil filter suitable for projection exposure of isolated patterns, e.g., contact holes, or a pupil filter suitable for projection exposure of relatively dense patterns, e.g., a filter for L&S patterns, is loaded, unloaded or exchanged.

To attain the above-described object, the present invention provides a projection exposure apparatus having an illuminating optical system for irradiating a mask having a pattern with illuminating light for exposure, and a projection optical system which is composed of a plurality of optical elements and arranged to receive light emanating from the pattern of the mask and to project an image of the pattern on a photosensitive substrate with predetermined image-forming characteristics. The projection exposure apparatus further includes an optical corrector plate inserting device whereby an optical corrector plate that changes a specific factor in the image-forming characteristics is removably inserted into a space defined by a Fourier transform plane of the projection optical system and a neighboring plane. In addition, an optical element moving device causes at least one of the optical elements to move relative to the entire projection optical system in accordance with the insertion of the optical corrector plate.

In one embodiment of the present invention, the optical corrector plate inserting device is an exchanging device that exchangeably inserts into the above-described space one of a plurality of optical filters which are different in optical action from one other.

One of the optical filters is a Super FLEX pupil filter that changes at least either the transmittance or phase (amplitude transmittance) of transmitted light at a part of the Fourier transform plane, or a filter for L&S patterns.

One of the optical filters is a SFINCS pupil filter that reduces coherence between light passing through a specific region of the Fourier transform plane and light passing through the other region of the Fourier transform plane.

One of the optical filters is a pupil filter that causes no change of the transmittance, phase or coherence of light passing through the Fourier transform plane, that is, a pupil filter which provides a state equivalent to an ordinary state where no pupil filter is present (however, a simple plane-parallel vitreous material may be inserted).

The projection exposure apparatus of the present invention is provided with an optical element moving device that causes at least one of the constituent elements of the projection optical system to move relative to the entire projection optical system. Accordingly, a variation of the image-forming characteristics which is caused by loading, unloading or exchange of a pupil filter can be corrected by the action of the optical element moving device. Thus, favorable image-forming characteristics can be obtained at all times.

The above and other objects, features and advantages of the present invention will become more apparent from the following description of the preferred embodiments thereof, taken in conjunction with the accompanying drawings, in which like reference symbols denote like elements.

DESCRIPTION OF THE PREFERRED EMBODIMENTS

The present invention will be described below in detail with reference to the accompanying drawings.

Figure 1:
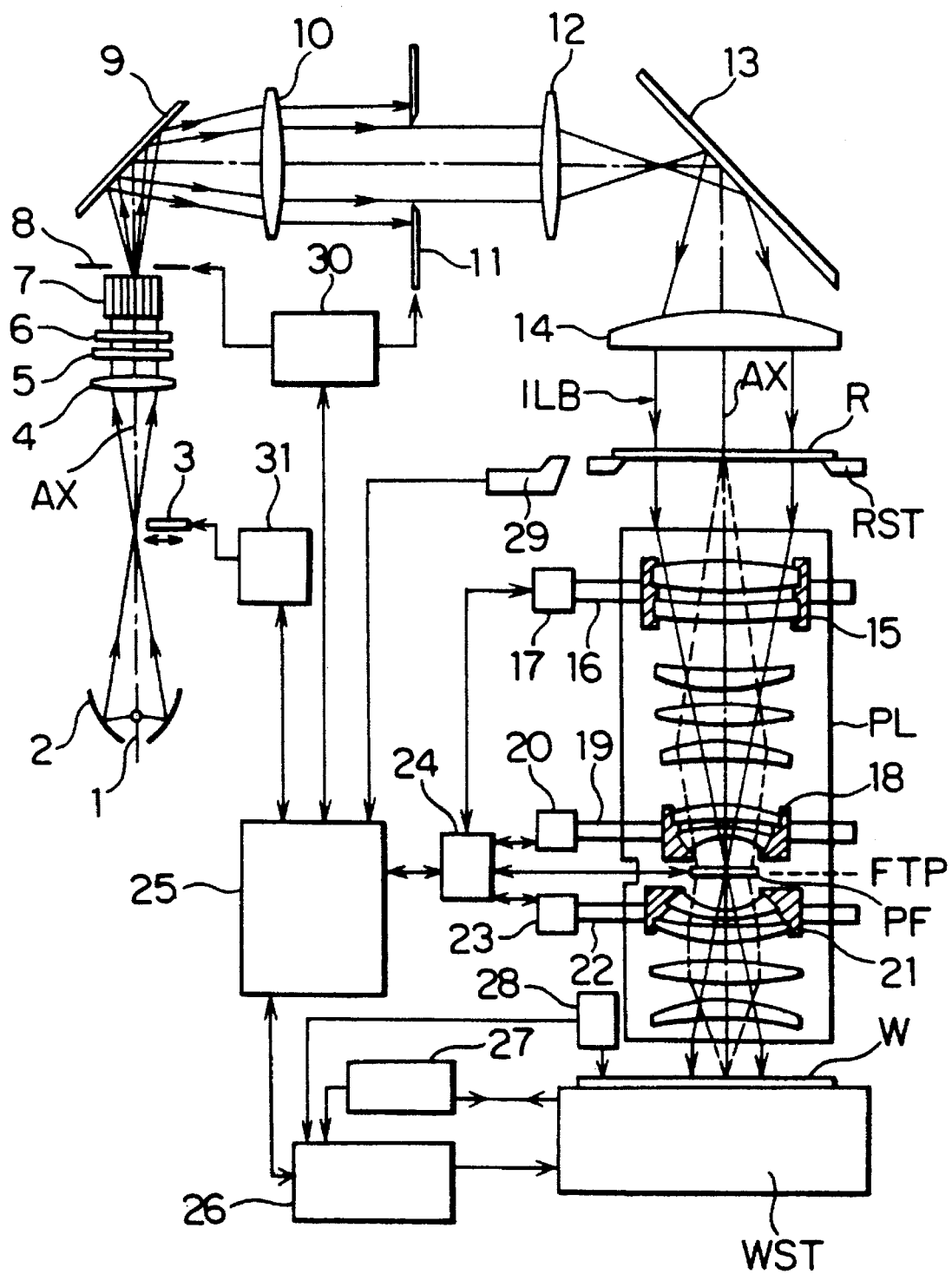
FIG. 1 is a schematic view showing the arrangement of one embodiment of the projection exposure apparatus according to the present invention.

FIG. 1 shows one embodiment of the projection exposure apparatus according to the present invention. Referring to the figure, a reticle R has a pattern to be transferred drawn on a pattern surface defined on the lower side (projection optical system side) thereof. The pattern is projected on a substrate to be exposed, e.g., a wafer W, through a projection optical system PL and transferred thereto by exposure. An illuminating light beam ILB for illuminating the reticle R is emitted from a light source, e.g., a mercury-vapor lamp 1. From the emitted light, only the i-line (wavelength: 0.365 μm), for example, is selected through an elliptical mirror 2, an input lens 4, a short-wavelength cut filter 5 and an interference filter 6. The illuminating light (i-line) emanating from the interference filter 6 then enters a fish-eye lens 7. It should be noted that a light source used in the exposure apparatus of the present invention is not necessarily limited to an emission line lamp such as a mercury-vapor lamp. For example, a beam from a laser light source or the like may be made incident on the fish-eye lens 7 after being collimated.

The exit-side surface of the fly-eye lens 7 forms a Fourier transform plane in the illuminating optical system with respect to the reticle pattern, where a surface illuminant image (i.e., a plane composed of the set of a plurality of point light sources corresponding to the element lenses of the fly-eye lens 7) is formed, and where a σ stop 8 that defines the shape and size of the surface illuminant image is also provided.

The illuminating light emanating from the fly-eye lens 7 and passing through the σ stop 8 illuminates the reticle R via mirrors 9 and 13, lens systems 10 and 12 and a condenser lens 14. A variable illuminating field stop (reticle blind) 11 is placed in conjugate relation to the pattern surface of the reticle R by the action of the lens system 12 and the condenser lens 14, thereby enabling the reticle illuminating range to be varied. The lens system 10 is set so that the σ stop 8 (surface illuminant image) forms a Fourier transform plane with respect to the reticle blind 11 or the pattern surface of the reticle R.

The bundle of rays transmitted and diffracted by the reticle R is focused by the projection optical system PL to form a pattern image of the reticle R on the wafer W. It should be noted that the broken line extending from the reticle R to the wafer W in FIG. 1 shows the optical path of a bundle of image-forming rays emanating from one hole pattern on the reticle R. In this embodiment, the projection optical system PL is designed so that a pupil plane FTP in the projection optical system PL, i.e., an optical Fourier transform plane with respect to the reticle R, lies in a hollow space, and an optical corrector plate is provided on the pupil plane FTP or a plane neighboring to it. In this example, the optical corrector plate is one pupil filter PF selected from among a plurality of optical filters, which will be described later. Although the system shown in FIG. 1 employs Koehler illumination in which the pupil plane FTP in the projection optical system PL is conjugate to the position of the surface illuminant image defined by the σ stop 8 in terms of geometrical optics, it should be noted that the illumination method is not necessarily limited to the Koehler illumination.

The projection optical system PL is composed of a multiplicity of lens systems. Some of the lens systems are retained by respective movable retaining members 15, 18 and 21, which are joined to driving mechanisms 17, 20 and 23 through support members 16, 19 and 22, respectively, so that these lens systems are movable relative to the entire projection optical system PL. These optical element moving devices (i.e., the movable retaining members, support members and driving mechanisms) are controlled by an optical system controller 24. The movement of each movable lens system by the associated optical element moving device is effected mainly along the optical axis AX of the projection optical system PL. However, there are cases where it is necessary to move a movable lens system in a direction perpendicular to the optical axis AX or to rotate it about an axis other than the optical axis AX (i.e., to tilt the lens system), as described later. Therefore, it is desirable for each movable lens system to be movable (rotatable) with multiple of degrees of freedom.

Loading, unloading or exchange of a pupil filter causes variation of various optical aberrations. Among the aberrations, variations in spherical aberration in particular can be effectively compensated for by moving one or a plurality of lens elements retained by the movable retaining members 18 and 21 in the vicinity of the pupil plane FTP. Variations in distortion, astigmatism and field curvature can be effectively compensated for by moving one or a plurality of lens elements retained by the movable retaining member 15 in the vicinity of the reticle R. Thus, compensation (correction) for general variations in aberration can be satisfactorily made by moving each lens element only along the optical axis.

The optical system controller 24 also effects control for the exchange of a pupil filter PF. Since an optimum amount of movement (rotation) of each movable lens element may vary with the pupil filter PF used, the optical system controller 24 is set so that the amount of movement or rotation of each movable lens element is optimized synchronously with the exchange of the pupil filter PF. It should be noted that a command as to which pupil filter should be used for exposure can be appropriately input to a main control system 25 by the operator through a console (not shown) or the like. However, since a type of appropriate pupil filter PF is solely determined by the type of reticle pattern to be transferred, filters may be automatically exchanged by reading the name, code or the like of a reticle R to be used with a bar code reader 29, for example, and determining a type of pupil filter PF to be used on the basis of the recognized name or code. In this case also, each movable lens element is moved to and set at an optimum position according to a selected pupil filter PF under the control of the optical system controller 24, as a matter of course.

Incidentally, the wafer W is retained on a holder of a wafer stage WST which is adapted to move two dimensionally in an XY-plane perpendicular to the optical axis AX. The position of the wafer stage WST is accurately measured by a length measuring machine, e.g., a laser interferometer 27. A wafer alignment sensor 28 detects the position of an alignment mark (registration mark) formed on the wafer W or a positional error. A stage controller 26 controls a motor for driving the wafer stage WST on the basis of the value detected by the wafer alignment sensor 28 and the value measured by the laser interferometer 27, thereby setting the wafer W to an accurate exposure position.

The main control system 25 sends commands not only to the optical system controller 24 but also to the stage controller 26, a shutter controller 31, a σ stop and reticle blind controller 30, etc. to control the opening and closing operation of a shutter 3 disposed in the vicinity of the second focal point of the elliptical mirror 2 and to control the aperture setting of the σ stop 8 or the reticle blind 11.

Figure 2:
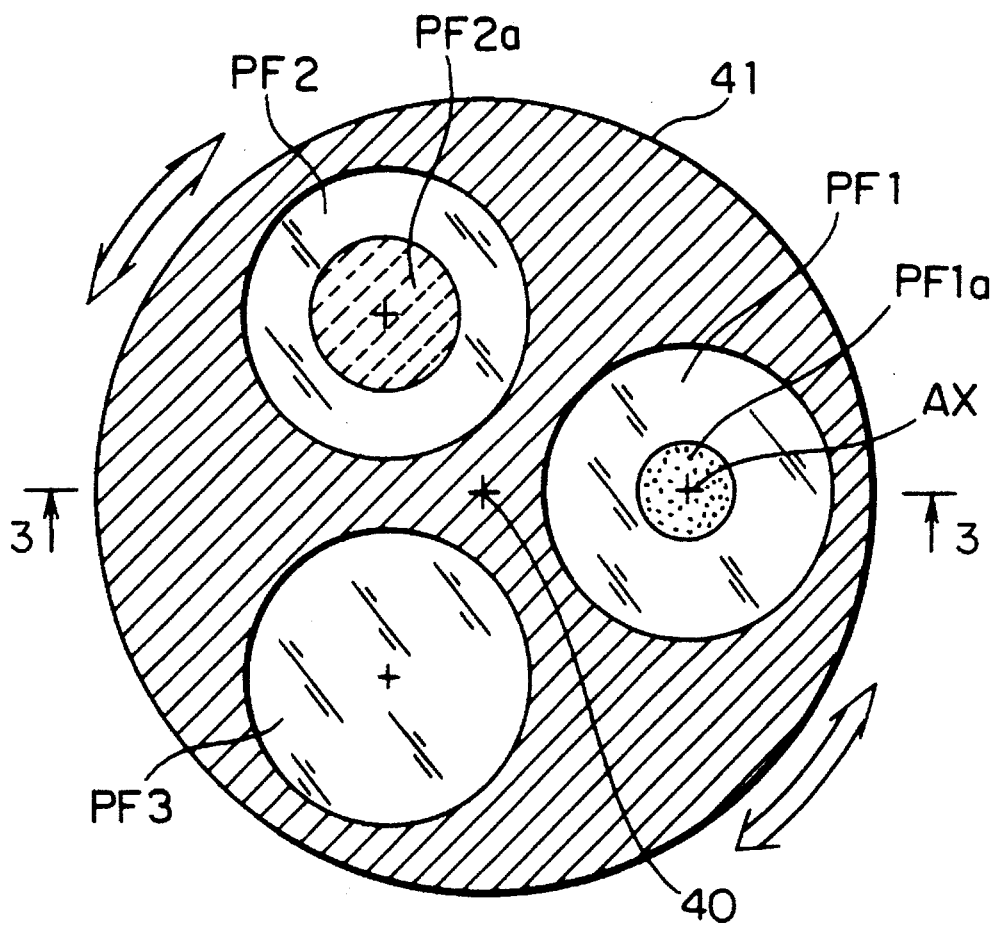
FIG. 2 is a plan view of pupil filters as shown in FIG. 1 and a pupil filter exchanging mechanism.

FIG. 2 is a plan view showing pupil filters PF and a pupil filter exchanging mechanism. Three different types of pupil filters PF1, PF2 and PF3 are retained on a rotary plate 41 at regular spacings of 120°. The rotary plate 41 is rotatable about an axis 40 of rotation. It is assumed that, in the state illustrated in the figure, a Super FLEX pupil filter PF1, which inverts the phase of light passing through a central circular region PF1a with respect to the phase of light passing through an annular region surrounding the circular region PF1a, has been loaded on the pupil plane in the image-forming optical path of the projection optical system PL as a pupil filter which is suitable for exposure of contact hole patterns. The phase inversion may be effected either continuously or stepwisely.

Figure 3:
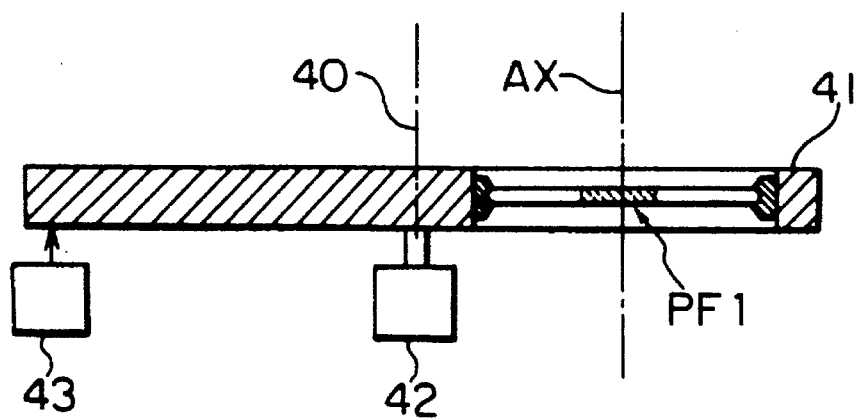
FIG. 3 is a sectional view as seen in the direction of the arrow 3—3 in FIG. 2.
Figure 4:
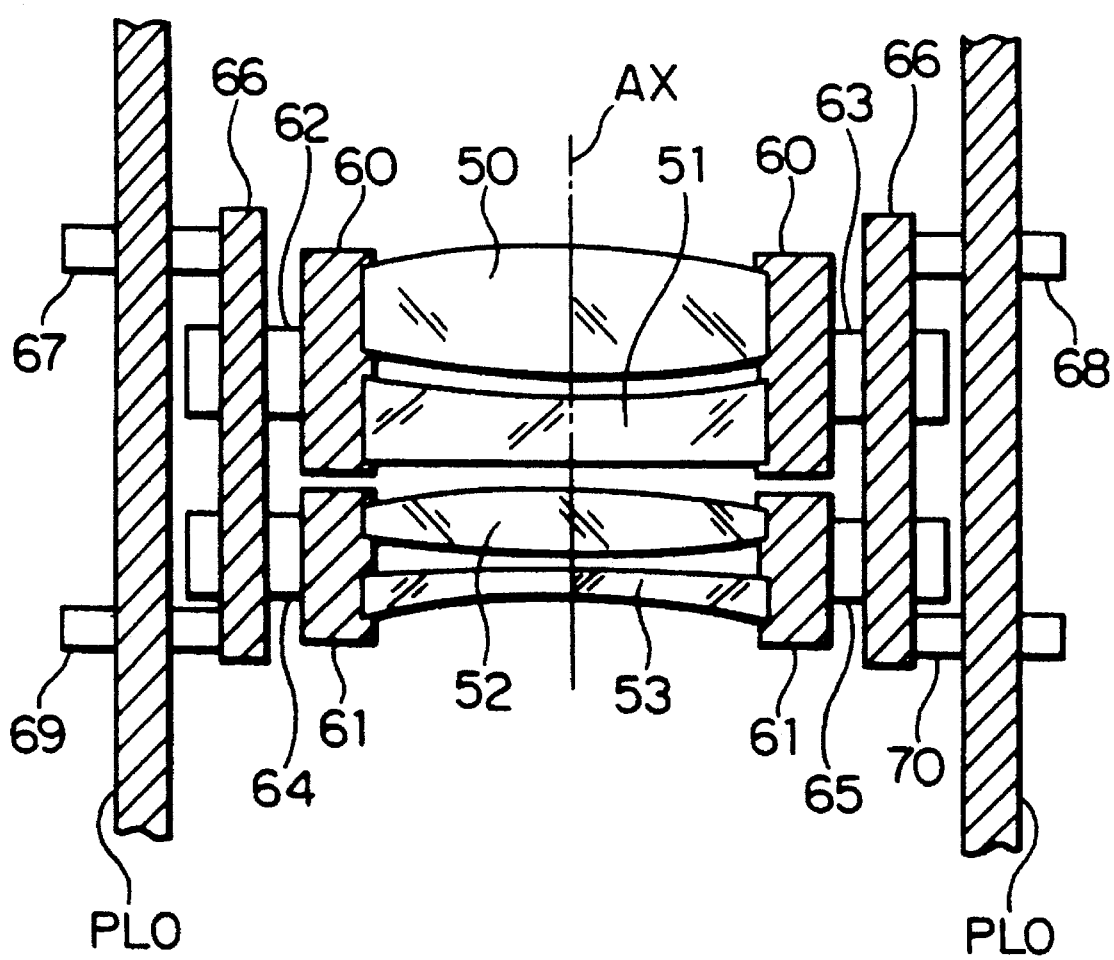
FIG. 4 shows a modification of a movable retaining mechanism as shown in FIG. 1.

FIG. 3 is a sectional view of a pupil filter PF and the pupil filter exchanging mechanism as seen in the direction of the arrow 3—3 in FIG. 2. The rotary plate 41 is caused to rotate about the axis 40 of rotation by a rotation driving unit 42, which is retained by a projection optical system lens mount PL0 (FIG. 4). In addition, an encoder 43 is provided to accurately measure the rotational position of the rotary plate 41, and it is assumed that the rotary plate 41 has grating patterns (scale patterns) cut in the peripheral edge thereof for indexing.

As one example, the Super FLEX pupil filter PF1 is formed from a transparent flat plate of glass, quartz, etc. which has a transparent dielectric film formed over its central circular region PF1a. Of the other two pupil filters, the filter PF2 is arranged such that the transmittance of a circular region PF2a defined in the center of the filter PF2 is lower than the transmittance of the surrounding region. The pupil filter PF2 is used for exposure of L&S (line and space) patterns. The pupil filter PF2 is formed from a transparent flat plate having a light-absorbing member, e.g., a metal thin film, formed over its central circular region PF2a. It is even more preferable that, when a pupil filter for L&S patterns is to be used, the illumination of the reticle R by the illuminating optical system 1 to 14 should be effected by the so-called annular zone illumination method. Accordingly, the σ stop 8 in FIG. 1 is preferably adapted to be compatible with annular zone illumination. More specifically, the surface illuminant image is partially obscured by the σ stop 8 so that it is formed into an annular zone shape. Therefore, it is preferable to prepare a plurality of σ stops 8 having different aperture configurations and to arrange the system so that the σ stops 8 can be appropriately exchanged by an exchanging mechanism similar to that shown in FIG. 2.

The other filter PF3 is formed from a uniform transparent flat plate (i.e., plain glass) which gives neither a transmittance difference nor a phase difference over the entire surface thereof. That is, the filter PF3 provides a state equivalent to a state where no pupil filter is used. The reason why such a filter PF3 is needed is that the other two pupil filters PF1 and PF2 are transparent plates each having an optical thickness; therefore, when neither of the pupil filters PF1 and PF2 is used, the optical characteristics must be compensated for in a manner such that an optical thickness equal to that of the pupil filters PF1 and PF2 is ensured, that is, it is necessary to perform an operation of making the optical path length uniform.

For the same reason, it is preferable that the optical thicknesses of a plurality of pupil filters used in the present invention should be approximately equal to each other. However, in this embodiment each movable lens element in the projection optical system PL can be adjusted to an optimum position in accordance with each pupil filter by the optical element moving device so that variation of the image-forming characteristics (i.e., increase in aberration) caused by exchange of pupil filters is minimized. Therefore, the tolerance for variation in optical thicknesses of a plurality of pupil filters can be markedly increased in comparison to an arrangement having no movable lens elements.

Further, the optical element moving device makes it possible to compensate for not only thickness variation among a plurality of pupil filters but also unevenness of the thickness, particularly the taper component in each pupil filter. Therefore, the tolerance for errors in production of the pupil filters themselves can be relaxed considerably. This means that the production cost of the pupil filters can be reduced to a considerable extent.

Since the compensation for unevenness of the taper component cannot satisfactorily be made by simply moving each movable lens element along the optical axis as described above, it is preferable to structure a specific movable lens element so that it is rotatable in a selected direction (about a selected axis) together with the associated movable retaining member (15, 18, 21, etc.). The rotation of a specific movable lens element herein means extremely slight tilt, and the associated rotating mechanism is only required to have a structure which enables tilting of the movable retaining member.

The movable retaining members (15, 18, 21, etc.) may be retained directly by the lens mount of the projection optical system PL through the support members (16, 19, 22, etc.), as shown in FIG. 1. Alternatively, the movable retaining members (15, 18, 21, etc.) may be retained, as shown in FIG. 4, by a projection optical system lens mount PL0 through an intermediate lens mount 66. In this case, the degree of freedom for movement of the movable lens elements 50, 51, 52 and 53 further increases. FIG. 4 shows a modification of each movable retaining mechanism in the arrangement shown in FIG. 1. Two movable lens elements 50 and 51 are fixed to an inner lens mount 60, and two movable lens elements 52 and 53 are fixed to another inner lens mount 61. These two inner lens mounts 60 and 61 are spaced apart from each other in the direction of the optical axis AX. A pair of support members 62 and 63 retain the inner lens mount 60 with respect to the intermediate lens mount 66, and another pair of support members 64 and 65 retain the inner lens mount 61 with respect to the intermediate lens mount 66. The intermediate lens mount 66 is retained with respect to the outer lens mount PL0 through support members 67, 68, 69 and 70.

With the above-described arrangement, when the four movable lens elements 50 to 53 are to be slightly moved together along the optical axis AX, the intermediate lens mount 66 is moved vertically by actuating a driving mechanism (e.g., a motor, air piston, piezoelectric element, etc.) joined to each of the support members 67 to 70. When a pair of movable lens elements 50 and 51 or 52 and 53 are to be moved singly, driving mechanisms which are joined to the pair of support members 62 and 63 or 64 and 65, which retain the respective inner lens mounts 60 and 61, should be actuated independently. The inner lens mount 60 or 61, which has a pair of movable lens elements fixed thereto, may be adapted to be tiltable. Further, at least either one of the inner lens mounts 60 and 61 may be adapted to be capable of moving slightly in a plane perpendicular to the optical axis AX.

Incidentally, pupil filters applicable to the present invention are not necessarily limited to the three types. It is also possible to use other types, described above, of pupil filters, for example, a light-blocking filter wherein a circular region in the vicinity of the optical axis is shielded from light, as described above, and a SFINCS pupil filter that reduces the spatial coherence of a bundle of rays passing through the pupil plane, as described above. The SFINCS pupil filter enables an improvement of the focal depth when an image of a contact hole pattern is formed by reducing the coherence between light passing through a circular region in the vicinity of the optical axis and light passing through an annular region at the outer periphery of the pupil plane. The coherence may be reduced by a method wherein an optical path length not less than the coherence length (about 25 μm in the case of the i-line having a wavelength of 365 nm and a wavelength width $\Delta\lambda$ of 5 nm) is given between two bundles of rays which respectively pass through a central circular region and an annular region surrounding it. In this case, a transparent substrate in which the central circular portion and the peripheral annular portion are different from each other in thickness or refractive index is used as an actual pupil filter plate.

It is also possible to reduce the coherence by a method wherein light passing through a region in the vicinity of the optical axis and light passing through an outer peripheral region of the pupil plane differ in polarization characteristic. An actual pupil filter plate used in this case comprises a transparent substrate and polarizing plates, a halfwave plate and quarter-wave plate disposed on the substrate so that the directions of linear polarization in the central circular portion and the peripheral annular portion intersect perpendicularly to each other.

In FIG. 5, section (A), (B) and (C) show examples of SFINCS pupil filters. As shown in FIG. 5(A), a basic SFINCS pupil filter is formed from a transparent circular substrate having a radius $D_0$ slightly larger than the effective pupil radius $r_0$ in the projection optical system PL, and has a central circular region PFc with a radius $r_1$ ($r_1<r_0$) and an annular region $PFs_1$ with an inner radius $r_1$ and an outer radius $r_0$. In order to prevent interference between a bundle of image-forming rays passing through the circular region PFc and a bundle of image-forming rays passing through the annular region $PFs_1$, the optical path length difference (thickness difference) between the circular region PFc and the annular region $PFs_1$ is set to be not less than the coherence length of illuminating light for exposure, or the circular region PFc and the annular region $PFs_1$ are formed from polarizing materials whereby bundles of image-forming rays respectively passing through these two regions are made different from each other in the condition of polarization. In the case of a SFINCS pupil filter as shown in FIG. 5(A), an optimum relationship between the radii $r_0$ and $r_1$ is given by $2r_1^2=r_0^2$, that is, $0.707r_0=r_1$. When the optimum condition is satisfied, the largest focal depth enlarging effect is theoretically. This condition is analytically deduced under conditions in which the amount of wavefront aberration of an image formed by a ray bundle passing through the circular region PFc and the amount of wavefront aberration concerning an image formed by a ray bundle passing through the annular region $PFs_1$ are made approximately equal to each other.

Figure 5A:
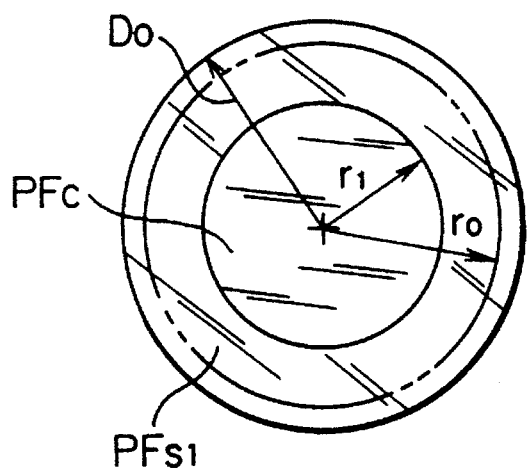
FIG. 5 shows various pupil filters wherein sections (A), (B) and (C) show examples of SFINCS pupil filters, and section (D) shows one example of a light-blocking pupil filter formed from a metal plate.
Figure 5B:
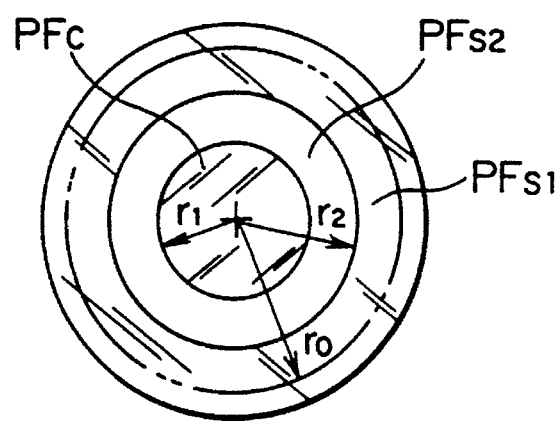

FIG. 5(B) shows a SFINCS pupil filter in which the pupil plane is divided into three regions, that is, a central circular region PFc (radius $r_1$), an inner annular region $PFs_2$ (outer radius $r_2$) adjacent to the outer periphery of the circular region PFc, and an outer annular region $PFs_1$ (radius not less than $r_0$) adjacent to the outer periphery of the inner annular region $PFs_2$. In this case, an optimum condition is given by $r_1^2=(r_2^2-r_1^2)=(r_0^2-r_2^2)$. The pupil filter is arranged such that there is no interference between a bundle of image-forming rays passing through the circular region PFc and a bundle of image-forming rays passing through the inner annular region $PFs_2$, which is adjacent to the circular region PFc, and that there is no interference between a bundle of image-forming rays passing through the inner annular region $PFs_2$ and a bundle of image-forming rays passing through the outer annular region $PFs_1$. The condition in this case is also uniquely obtained under conditions in which the amounts of wavefront aberration with respect to unit defocus quantity of bundles of image-forming rays passing through the three regions PFc, $PFs_1$ and $PFs_2$ are made approximately equal to each other.

Figure 5C:
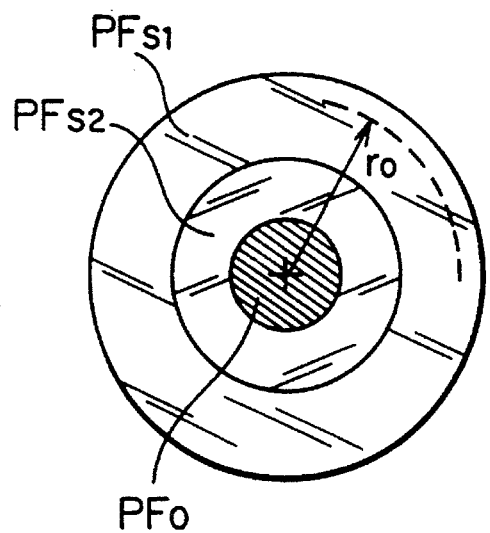

FIG. 5(C) shows a SFINCS pupil filter formed by providing a light-blocking portion PFo having a predetermined radius in the center of the circular region PFc of the pupil filter as shown in FIG. 5(A). As a result, the circular region PFc in FIG. 5(A) forms an annular region $PFs_2$.

The SFINCS pupil filters shown in sections (A), (B) and (C) of FIG. 5 are different in the principle of image formation from multifocus filters such as Super FLEX pupil filters. That is, formation of an image of a projected contact hole pattern is effected by an image-forming ray bundle composed of partial ray bundles divided so as to be incoherent to each other. Accordingly, on the image plane, the partial ray bundles form intensity distributions of the hole pattern image independently from one another, which are added together in terms of light intensity (i.e., incoherent addition; in the Super FLEX method, coherent addition is made). All images that are formed by the partial ray bundles suffer from minimal wavefront aberration when they are defocused. That is, assuming that the image-forming system having a SFINCS pupil filter is defocused in order to produce the same amount of wavefront aberration as that produced when a conventional image-forming system that uses the effective pupil diameter $r_0$ as it is defocused by $\Delta F$, in the case of the filter shown in FIG. 5(A), the image-forming system is allowed to be defocused up to $2\times\Delta F$. In the case of the filter shown in FIG. 5(B), the image-forming system is allowed to be defocused up to $3\times\Delta F$.

Figure 5D:
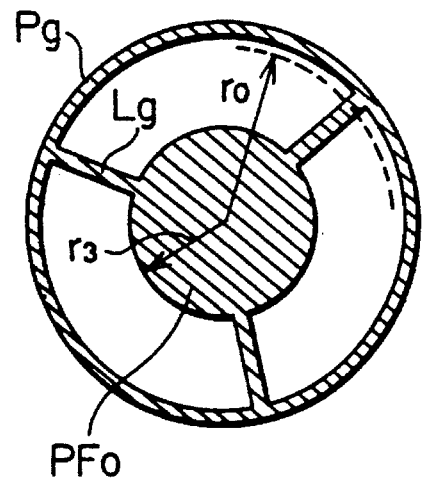

Although in the foregoing embodiment all the pupil filters use a transparent substrate having an optical thickness as a base, the present invention is not necessarily limited to the described arrangement. For example, the light-blocking pupil filter may be a light-blocking plate formed by hollowing out a light-blocking metal plate such that only a portion serving as a light-transmitting portion is removed, with a central circular region left as it is (the relationship between the radius $r_3$ of the central circular region and the effective pupil radius $r_0$ is preferably as follows: about $0.3r_0 \leq r_3 \leq$ about $0.7r_0$). Such a light-blocking plate is detailed in Japanese Patent Application Disclosure (KOKAI) No. Hei 04-179958 (corresponding to U.S. Ser. No. 76,429 filed on Jun. 14, 1993), which has been mentioned above. In a case where such a light-blocking pupil filter is used for contact hole patterns, in order to realize "a state where no pupil filter is used" as in the conventional practice, a filter having no optical thickness is used, provided that the idea of matching optical path lengths with each other is followed in the same way as in the foregoing embodiment. That is, when there is a need for a pupil filter for providing a conventional state where no pupil filter is used, it is not necessary to use a uniform transparent flat plate such as that described above (see PF3 in FIG. 2), but it is only necessary to remove a light-blocking pupil filter as shown in FIG. 5(D) from the pupil plane FTP. Although in the light-blocking plate formed from a metal plate, shown in FIG. 5(D), the central circular light-blocking portion PFo is joined to the peripheral annular light-blocking portion Pg by three spoke-shaped rims Lg at regular spacings of 120°, the two light-blocking portions PFo and Pg may be joined by two rims Lg which are spaced 180° apart from one another. Further, the metal plate filter shown in FIG. 5(D) does not necessarily need to be formed from a completely light-blocking material, but may be formed by using a material which gives an appropriate transmittance to the central circular region, or a dense mesh-shaped material.

Incidentally, in a projection optical system from which various aberrations have been completely eliminated, no secondary image-forming characteristic variation occurs in theory when the projection optical system is loaded with a light-blocking pupil filter formed from a metal plate having no optical thickness as described above. In an actual projection optical system, however, slight aberration is left uncorrected because of the heterogeneity of the vitreous material itself, a possible small manufacturing error of each lens element, etc. It is a matter of course that such residual aberration is held down to such an extent that there is practically no problem in terms of each factor in image-forming characteristics between the reticle R and the wafer W by finely adjusting the relative position between the optical elements and so forth at the final adjusting stage. However, it is difficult to adjust the positional relationships between the pattern surface of the reticle R and the pupil plane FTP and between the pupil plane FTP and the surface of the wafer W to a strict optical Fourier transform relation while maintaining the required various image-forming characteristics. As long as various image-forming characteristics are considered to be of high priority, there are cases where the optical Fourier transform relation cannot strictly be satisfied.

In a projection optical system where the Fourier transform relation is not strictly maintained as described above, secondary image-forming characteristics (particularly aberrations) are likely to vary when a light-blocking pupil filter formed from a metal plate is loaded. However, the optical element moving device in the present invention can also compensate for such aberration variation, as a matter of course.

Although the projection optical system that is used in the foregoing embodiment is an image-forming system having no or minimal aberration, there are cases where an even more favorable transfer image can be obtained by positively producing specific aberrations, particularly spherical aberration, for the transfer of a certain type of pattern. Therefore, in a case where a pupil filter is exchanged according to a pattern (reticle) to be transferred and aberration variation is compensated by the action of the optical element moving device according to the present invention, the optical element moving device may be set so that controllable spherical aberration is produced for a certain type of pattern.

Incidentally, many of recent projection exposure apparatuses are equipped with a mechanism for compensating for a variation of image-forming characteristics, which may be caused by external factors such as atmospheric pressure variation and accumulation of heat in various portions of the apparatus resulting from absorption of a part of exposure light, by controlling the atmospheric pressure in the space between specific optical elements in the projection optical system. Such a mechanism may be positively utilized so as to substitute for a part of the optical element moving device of the present invention.

There has also been proposed an arrangement in which a part of optical elements in the projection optical system is adapted to be movable as a device for compensating for a variation of image-forming characteristics caused by atmospheric pressure variation or heat accumulation. Such an existing arrangement may also be used to realize the function of the optical element moving device according to the present invention. Conversely, the optical element moving device of the present invention can also be used as a device for compensating for a variation of image-forming characteristics caused by external factors.

Figure 6A:
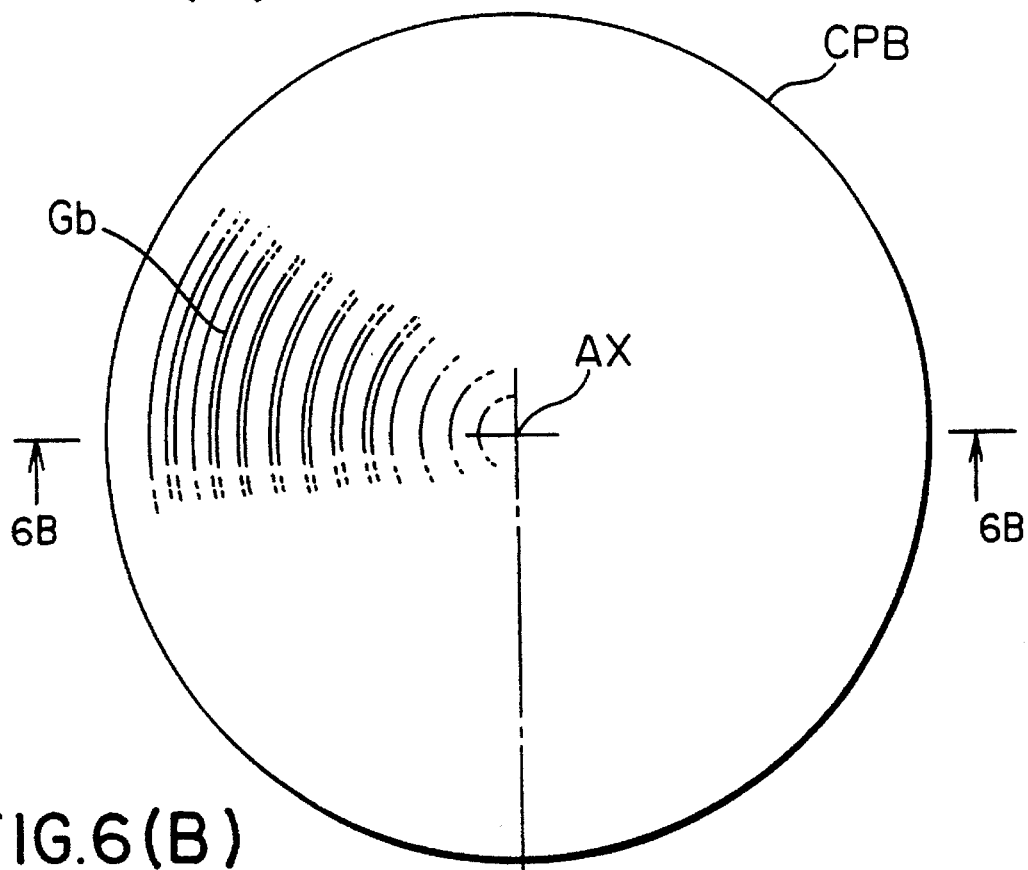
FIG. 6 shows one example of a Fresnel lens-shaped optical corrector plate which can be disposed on a pupil plane of a projection optical system in the present invention, wherein section (A) is a plan view and section (B) is a sectional view.
Figure 6B:
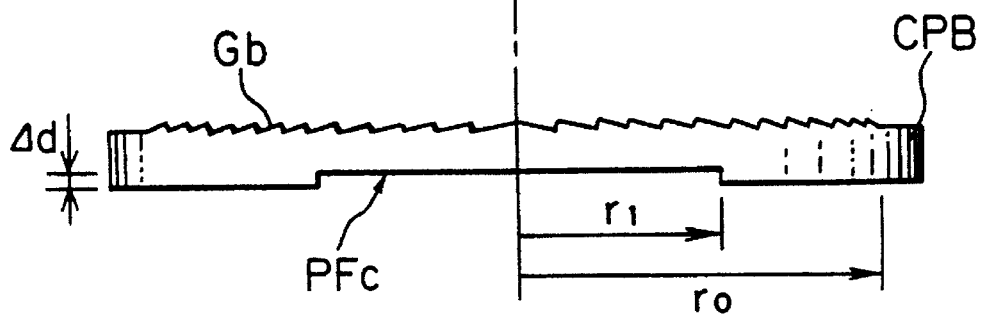

FIG. 6(A) is a plan view showing one example of a Fresnel lens-shaped optical corrector plate such as that disclosed in U.S. Pat. No. 4,936,665. FIG. 6(B) is a sectional view as seen in the direction of the arrow B–B' in FIG. 6(A). The Fresnel lens-shaped optical corrector plate can be disposed on the pupil plane FTP in the projection optical system PL to correct aberrations, particularly spherical aberration, wavefront aberration or chromatic aberration, among image-forming characteristics. As shown in sections (A) and (B) of FIG. 6, an optical corrector plate CPB has a plurality of concentric blazed grating patterns Gb cut in one surface thereof at predetermined radial spacings. The other surface of the optical corrector plate CPB is formed with a central circular region PFc with a step $\Delta d$ (not less than the coherence length) which functions as a SFINCS pupil filter by etching or other similar process. The optical corrector plate CPB according to the embodiment shown in FIG. 6 acts as a SFINCS pupil filter as a whole, and also has a function of self-correcting aberration, which will occur when the filter is inserted into the pupil plane FTP, by the blazed grating patterns (having Fresnel action) formed on the surface of the optical corrector plate CPB. Thus, the optical corrector plate CPB functions as a SFINCS pupil filter and also as a device for self-correcting aberration secondarily produced on account of the SFINCS pupil filter function. Accordingly, in a case where a pupil filter having a structure such as that shown in FIG. 6 is prepared, the desired results can be obtained simply by inserting and removing the pupil filter into and from the pupil plane FTP in the projection optical system PL. It should be noted that the pitch and height difference of the blazed grating patterns formed on the optical corrector plate CPB are determined so as to minimize aberration produced owing to the presence of an optical thickness of the optical corrector plate CPB. Further, the structure shown in FIG. 6 is applicable not only to SFINCS pupil filters but also to general pupil filters using a transparent substrate having an optical thickness as a base. Further, since the optical corrector plate CPB has Fresnel lens effect (i.e., it has a proper optical axis), it is necessary to set the position thereof (particularly the inclination) in the projection optical system PL with relatively high accuracy; under certain circumstances, a precision mechanism for fine adjustment in the XY-plane may be needed. In the embodiment shown in FIG. 6, the blazed grating surface of the optical corrector plate CPB is a movable optical element for image aberration correction in the present invention. Accordingly, the movable mechanism (the rotating plate 41 in FIG. 2) for loading, unloading and exchange of a pupil filter (i.e., the optical corrector plate CPB in this case) is used to function also as a mechanism for moving an optical element constituting the projection optical system. Further, the optical corrector plate is not necessarily limited to the Fresnel lens but may be a binary optics lens, as detailed in the above-mentioned U.S. Pat. No. 4,936,665.

Although in the foregoing embodiments the present invention has been described on the assumption that it is applied only to a stepper type projection exposure apparatus which has a projection optical system including a lens system and effects exposure by stepwise movement of a wafer stage, it should be noted that the present invention is applicable to any type of projection exposure apparatus, for example, an exposure apparatus having a reflecting optical system, or a scanning projection exposure apparatus, without or with slight modification, in addition to the stepper type projection exposure apparatus.

Incidentally, the foregoing embodiments of the present invention are arranged such that, when a pupil filter is exchanged (or loaded or unloaded), one or more optical lenses in the projection optical system PL are slightly moved to compensate for deterioration of the image-forming characteristics. However, there are cases where it is practically unnecessary to move optical lenses for compensation. That is, such fine adjustment of optical lenses may be unnecessary if the system is designed as follows: All pupil filters (including a simple plane-parallel vitreous material) which are to be inserted into the pupil plane FTP in the projection optical system PL are precisely produced with the same optical thickness, and optical design (production), particularly aberration design of the projection optical system PL is made so that the best characteristics can be obtained on the premise that a transparent plate having the above optical thickness will be present on the pupil plane FTP.

By designing the projection optical system PL as described above, exposure can be carried out with high resolution maintained at all times with substantially no change in imaging aberration and image distortion when ordinary exposure is carried out (using a simple plane-parallel filter) and when special exposure is carried out (using a filter for SFINCS, Super FLEX, etc.). Hence, it becomes possible to produce IC patterns of high accuracy.

Thus, according to the present invention, a plurality of different types of pupil filter can be exchangeably used in a single projection exposure apparatus. In addition, secondary image-forming characteristic change, particularly aberration variation, which results from exchange of each pupil filter, can be compensated by the action of an optical element moving device. Thus, favorable image-forming performance can be always obtained for any type of pupil filter. Consequently, it becomes possible to use a single projection exposure apparatus for a plurality of different types of pattern exposure process under optimum conditions. Thus, it is possible to further increase the efficiency of production of semiconductor integrated circuits, liquid crystal displays, etc.

Further, according to the present invention, even if there are some errors in production of a pupil filter which is to be used, it is possible to compensate for deterioration of image-forming characteristics (particularly aberrations), including the influence of the production errors. Therefore, the pupil filter production cost can be reduced to a considerable extent.

Although the present invention has been described through specific terms, it should be noted here that the described embodiments are not necessarily exclusive and that various changes and modifications may be imparted thereto without departing from the scope of the invention which is limited solely by the appended claims.

What is claimed is:

1. A projection exposure apparatus having an illuminating optical system for irradiating a mask having a pattern with illuminating light for exposure, and a projection optical system which is composed of a plurality of optical elements and arranged along an optical axis of said projection optical system to receive light emanating from the pattern of said mask and to project an image of said pattern on a photosensitive substrate with predetermined image-forming characteristics, said projection exposure apparatus comprising:

an optical corrector plate inserting device whereby an optical corrector plate which changes a specific factor in said image-forming characteristics is removably inserted into a space including a Fourier transform plane of said projection optical system; and an optical element moving device for causing at least one of said optical elements to move relative to the entire projection optical system in accordance with insertion of said optical corrector plate.

2. A projection exposure apparatus according to claim 1, wherein said optical corrector plate inserting device is an exchanging device that exchangeably inserts into said space one of a plurality of optical filters which are different in optical effect from one another.

3. A projection exposure apparatus according to claim 2, wherein one of said optical filters changes at least either one of transmittance and phase of transmitted light at a part of the Fourier transform plane in said projection optical system.

4. A projection exposure apparatus according to claim 2 or 3, wherein one of said optical filters reduces coherence between light passing through a specific region of the Fourier transform plane in said projection optical system and light passing through the other region of the Fourier transform plane.

5. A projection exposure apparatus according to claim 2, wherein one of said optical filters causes no change to transmittance, phase or coherence of light passing through the Fourier transform plane in said projection optical system.

6. A projection exposure apparatus according to claim 1, wherein said optical corrector plate inserting device has a first movable member for supporting said optical corrector plate and for removably inserting it into said space, and said optical element moving device has a second movable member for supporting said at least one optical element and for causing it to move relative to the entire projection optical system.

7. A projection exposure apparatus according to claim 6, wherein said projection optical system is arranged so that another factor in said image-forming characteristics becomes most desirable in one of two states, that is, a first state where said optical corrector plate is out of an image-forming optical path, and a second state where said optical corrector plate lies in the image-forming optical path, said projection exposure apparatus further comprising a controller for driving said first and second movable members in association with each other so that said at least one optical element is moved by a predetermined amount to compensate for a change of said another factor in the other of said first and second states.

8. A projection exposure apparatus according to claim 6 or 7, wherein said specific factor in said image-forming characteristics is image depth, and said another factor is image aberration.

9. A projection exposure apparatus according to claim 8, wherein said optical corrector plate is formed from a light-transmitting disk having a radius not less than an effective radius $r_0$ of the Fourier transform plane of said projection optical system, said light-transmitting disk being arranged to radially change optical characteristics of bundles of image-forming rays distributed over said Fourier transform plane.

10. A projection exposure apparatus according to claim 9, wherein said light-transmitting disk radially and continuously changes the optical characteristics of the bundles of image-forming rays distributed over said Fourier transform plane.

11. A projection exposure apparatus according to claim 9, wherein said light-transmitting disk radially and stepwisely changes the optical characteristics of the bundles of image-forming rays distributed over said Fourier transform plane.

12. A projection exposure apparatus according to claim 9, wherein said light-transmitting disk has such light-attenuating characteristics that transmittance of a central circular region with a radius $r_1$ is made zero or lower than transmittance of an annular region with an inner radius $r_1$ and an outer radius $r_0$, said radii $r_1$ and $r_0$ being set so as to satisfy the condition of about $0.3r_0 \leqq r_1 \leqq$ about $0.7r_0$.

13. A projection exposure apparatus according to claim 9, wherein said light-transmitting disk has three regions, i.e., a central circular region with a radius $r_1$, an inner annular region with an inner radius $r_1$ and an outer radius $r_2$, and an outer annular region with an inner radius $r_2$ and an outer radius $r_0$, said light-transmitting disk being formed from an optical material which vanishes coherence between at least ray bundles respectively passing through said inner and outer annular regions among the bundles of image-forming rays distributed over said Fourier transform plane, said radii $r_0$, $r_1$ and $r_2$ being set so as to satisfy the condition of $r_1^2 \approx r_2^2 - r_1^2 \approx r_0^2 - r_2^2$.

14. A projection exposure apparatus according to claim 13, wherein the central circular region of said light-attenuating disk is formed from a light-attenuating material.

15. A projection exposure apparatus according to claim 13, wherein said light-transmitting disk is formed from an optical material which vanishes coherence between a ray bundle passing through said central circular region and a ray bundle passing through said inner annular region.

16. A projection exposure apparatus according to claim 9, wherein said light-transmitting disk is formed from an optical phase material which radially varies amplitude transmittance for the bundles of image-forming rays distributed over said Fourier transform plane.

17. A projection exposure apparatus according to claim 16, wherein said light-transmitting disk is formed from an optical phase material which radially and continuously varies amplitude transmittance for the bundles of image-forming rays distributed over said Fourier transform plane.

18. A projection exposure apparatus according to claim 16, wherein said light-transmitting disk is formed from an optical phase material which radially and discretely varies amplitude transmittance for the bundles of image-forming rays distributed over said Fourier transform plane.

19. A projection exposure apparatus according to claim 9, wherein said projection optical system has a plurality of lens elements disposed along an optical axis between said mask and said Fourier transform plane, and a plurality of lens elements disposed along an optical axis between said Fourier transform plane and said photosensitive substrate, said second movable member causing at least one lens element near said Fourier transform plane in said projection optical system to move slightly along the optical axis.

20. A projection exposure apparatus having a projection optical system which is composed of a plurality of optical elements arranged along an optical axis of said projection optical system for projecting an image of pattern of a mask on a substrate, said projection exposure apparatus comprising:

an optical plate that changes image-forming characteristics adapted to be disposed in a space including a Fourier transform plane of said projection optical system; and an adjusting device for moving at least one of said optical elements to adjust an image aberration, wherein said image-forming characteristics include said image aberration.

21. A projection exposure method for projecting an image of pattern of a mask on a substrate using a projection optical system which is composed of a plurality of optical elements arranged along an optical axis of said projection optical system, said projection exposure method comprising:

inserting an optical plate into a space including a Fourier transform plane of said projection optical system; and moving at least one of said optical elements in accordance with insertion of said optical plate.

22. A projection exposure method for projecting an image of pattern of a mask on a substrate using a projection optical system which is composed of a plurality of optical elements arranged along an optical axis of said projection optical system, said projection exposure method comprising:

moving an optical plate relative to a space including a Fourier transform plane of said projection optical system; and adjusting an image aberration by moving at least one of said optical elements in accordance with movement of said optical plate.

* * * * *